(12) United States Patent
Raynor et al.

(10) Patent No.: US 11,994,425 B2
(45) Date of Patent: May 28, 2024

(54) OPTICAL SENSOR AND APPARATUS COMPRISING AN OPTICAL SENSOR

(71) Applicants: STMicroelectronics (Research & Development) Limited, Marlow (GB); STMicroelectronics (Grenoble 2) SAS, Grenoble (FR)

(72) Inventors: Jeffrey M. Raynor, Edinburgh (GB); Sophie Taupin, Saint Egreve (FR); Jean-Jacques Rouger, Saint Pierre de Mesage (FR); Pascal Mellot, Lans en Vercors (FR)

(73) Assignees: STMicroelectronics (Research & Development) Limited, Marlow (GB); STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 18/370,637

(22) Filed: Sep. 20, 2023

(65) Prior Publication Data
US 2024/0011828 A1 Jan. 11, 2024

Related U.S. Application Data

(60) Division of application No. 17/362,548, filed on Jun. 29, 2021, now Pat. No. 11,796,386, which is a
(Continued)

(30) Foreign Application Priority Data
Jan. 16, 2019 (EP) .................................. 19305052

(51) Int. Cl.
*G01J 1/42* (2006.01)
*G01J 1/44* (2006.01)
(Continued)

(52) U.S. Cl.
CPC ............... *G01J 1/4204* (2013.01); *G01J 1/44* (2013.01); *H01L 23/585* (2013.01);
(Continued)

(58) Field of Classification Search
CPC ...... G01J 1/44; G01J 1/4204; G01J 2001/446; G01J 2001/448; H01L 23/585; H01L 27/1443; H01L 27/1446; H01L 31/02019
See application file for complete search history.

(56) References Cited

U.S. PATENT DOCUMENTS 9,160,949 B2 10/2015 Zhang et al.
9,209,320 B1 12/2015 Webster
(Continued)

FOREIGN PATENT DOCUMENTS

WO 2006018477 A1 2/2006

OTHER PUBLICATIONS

EPO Search Report and Written Opinion for EP 19305052.3 dated Apr. 1, 2019 (8 pages).
(Continued)

*Primary Examiner* — Kevin K Pyo
(74) *Attorney, Agent, or Firm* — Crowe & Dunlevy LLC

(57) ABSTRACT

An optical sensor includes pixels. Each pixel has a photodetector. A readout circuit performs a process over an exposure time where the photodetector is connected to a reverse bias voltage supply to reset a voltage across the photodetector, and the photodetector is disconnected from the reverse bias voltage supply until that the voltage across the photodetector decreases in response to received ambient light. An ambient light level is then determine an based on a number of times the voltage across the photodetector is reset over the exposure time.

13 Claims, 13 Drawing Sheets

Related U.S. Application Data continuation of application No. 16/740,676, filed on Jan. 13, 2020, now Pat. No. 11,079,270.

(51) Int. Cl.
*H01L 23/58* (2006.01)
*H01L 27/144* (2006.01)
*H01L 31/02* (2006.01)

(52) U.S. Cl.
CPC ...... *H01L 27/1443* (2013.01); *H01L 27/1446* (2013.01); *H01L 31/02019* (2013.01); *G01J 2001/446* (2013.01); *G01J 2001/448* (2013.01)

(56) References Cited

U.S. PATENT DOCUMENTS

| | | |
|---|---|---|
| 9,521,337 B1 | 12/2016 | Shen et al. |
| 11,245,404 B2 | 2/2022 | Dahle et al. |
| 2008/0099689 A1 | 5/2008 | Nygard et al. |
| 2010/0140732 A1* | 6/2010 | Eminoglu .............. H04N 25/75 257/E27.001 |
| 2013/0278804 A1 | 10/2013 | Denham et al. |
| 2015/0200314 A1 | 7/2015 | Webster |

OTHER PUBLICATIONS

First Office Action from co-pending EP Appl. No. 19305052.3 dated Nov. 25, 2020 (7 pages).

Justin A Richardson et al: "Scaleable Single-Photon Avalanche Diode Structures in Nanometer CMOS Technology", IEEE Transactions on Electron Devices, vol. 58, No. 7, Jul. 2011 (8 pages).

Second Office Action from co-pending EP Appl. No. 19305052.3 dated Mar. 23, 2021 (6 pages).

Xu, Hesong, et al: "Crosstalk Characterization of Single-photon Avalanche Diode (SPAD) Arrays in CMOS 150nm Technology", ScienceDirect, Procedia Engineering 87 (2014) 1270-1273.

You, Ziyang, et al; "3um Pitch, 1um Active Diameter SPAD Arrays in 130nm CMOS Imaging Technology", 2017, Materials Science, 4 pages.

* cited by examiner

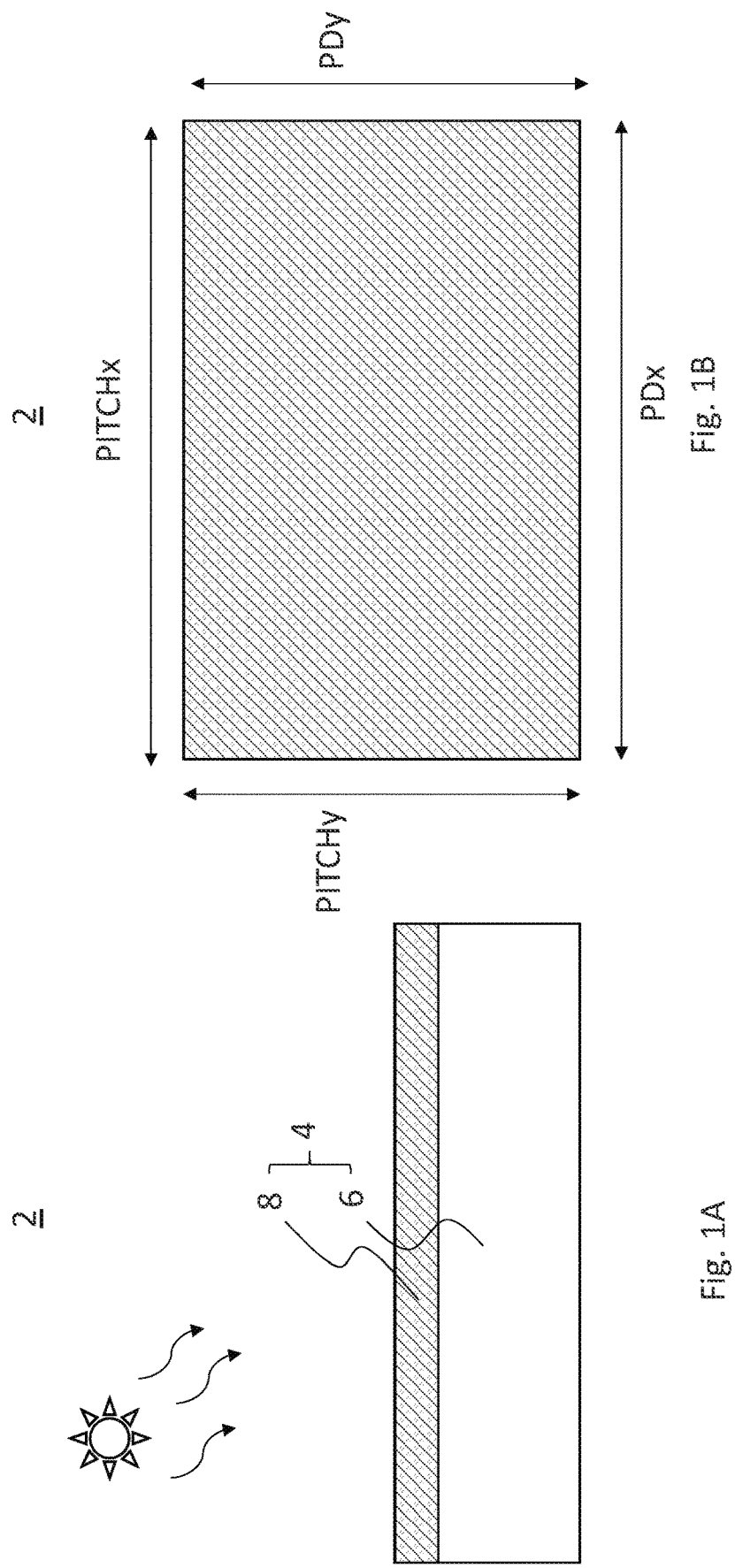

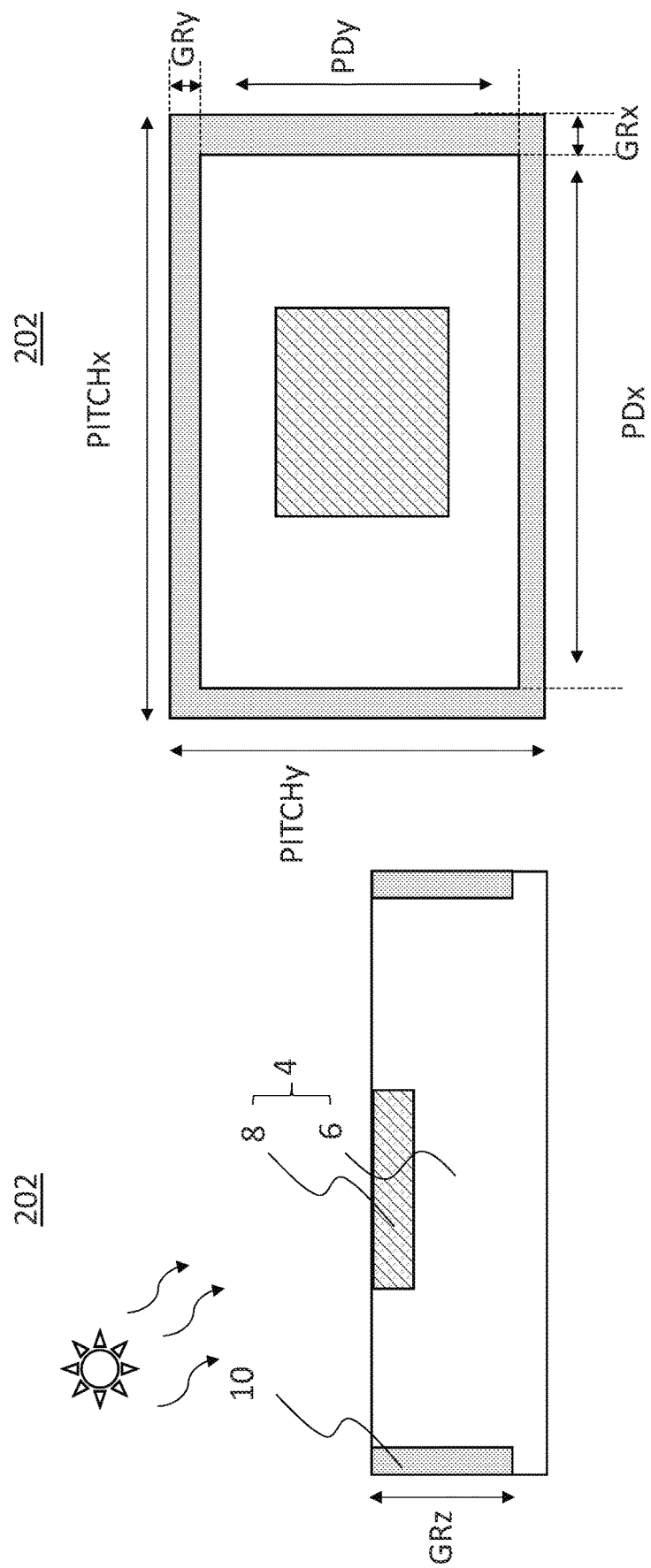

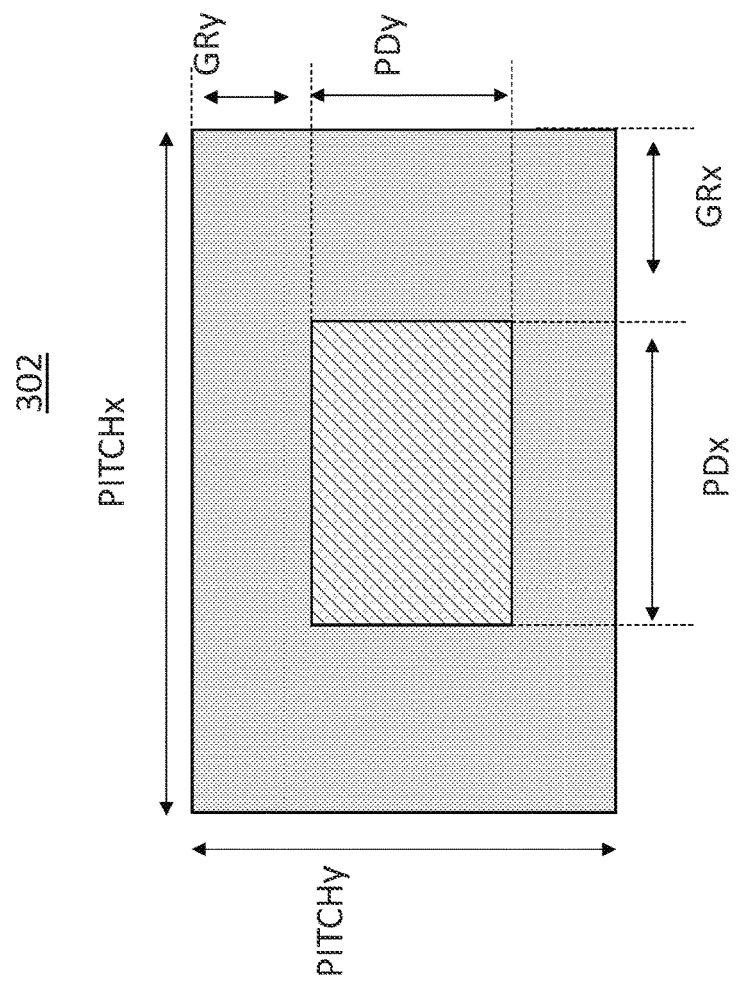
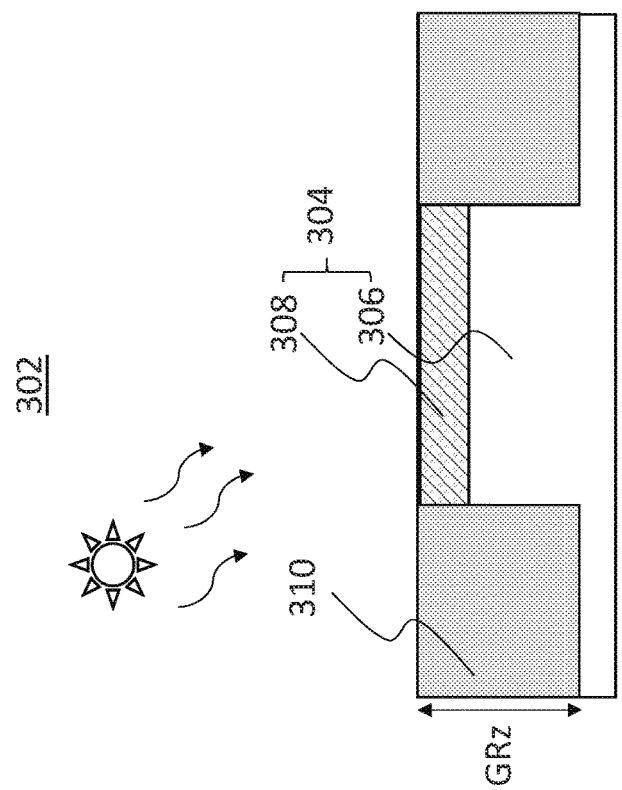
Fig. 6B
Fig. 6A

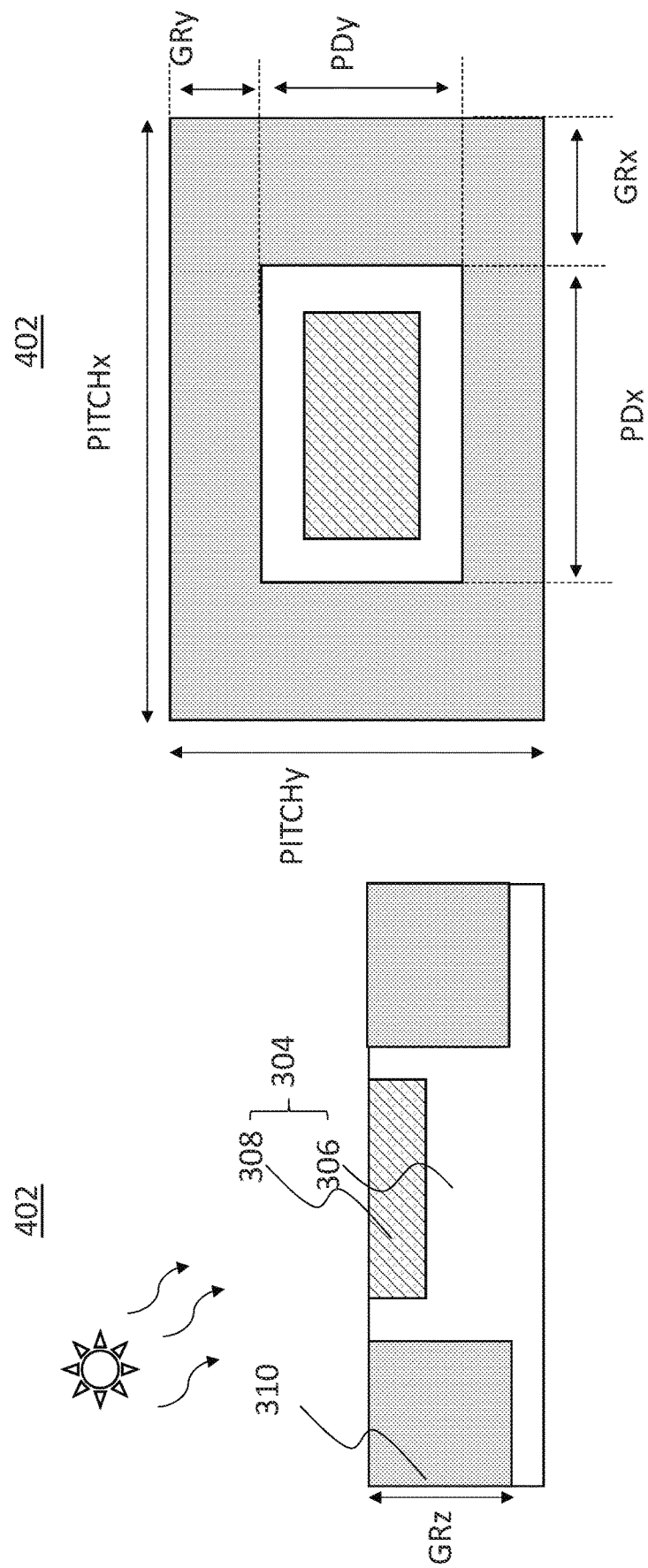

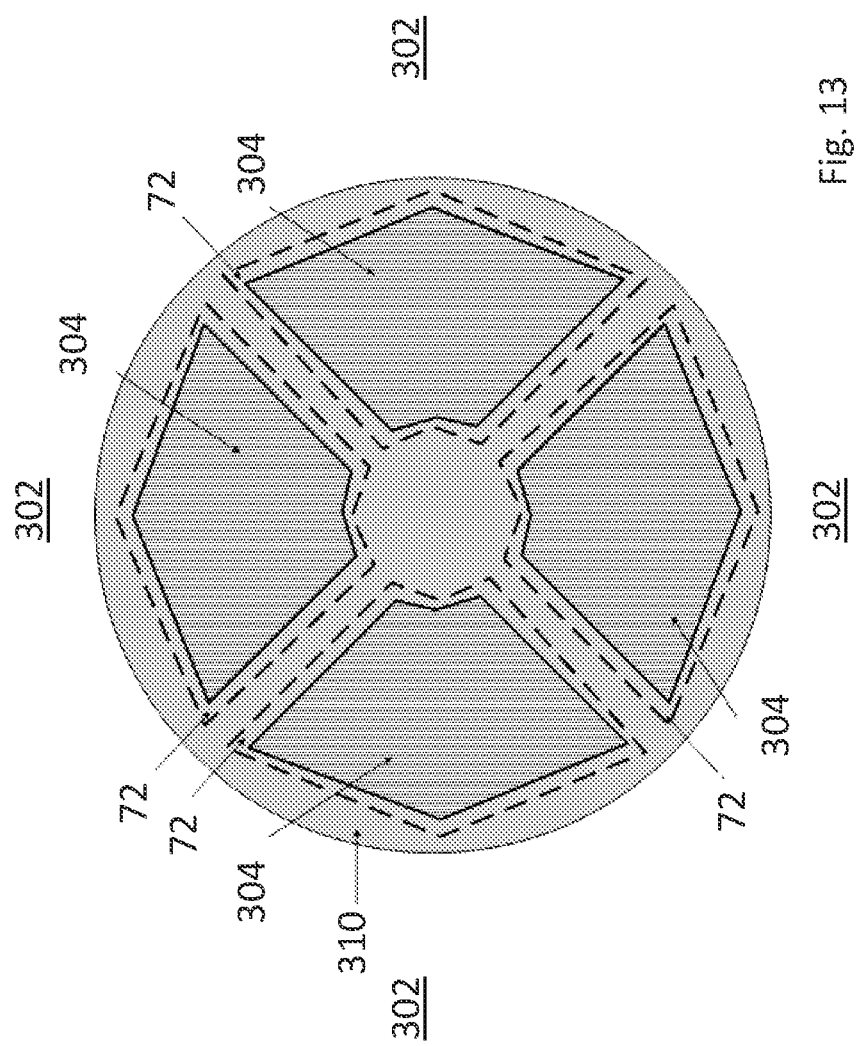

OPTICAL SENSOR AND APPARATUS COMPRISING AN OPTICAL SENSOR

CROSS REFERENCE TO RELATED APPLICATIONS

This application is a divisional of U.S. patent application Ser. No. 17/362,548, filed Jun. 29, 2021, which is a continuation of United States Application for patent Ser. No. 16/740,676, filed Jan. 13, 2020, which claims the priority benefit of European Application for Patent No. 19305052.3, filed on Jan. 16, 2019, the contents of which are hereby incorporated by reference in their entireties to the maximum extent allowable by law.

TECHNICAL FIELD

The present disclosure relates to an optical sensor and an apparatus comprising an optical sensor.

BACKGROUND

Some apparatus (e.g., mobile phones, tablet computers, laptop computers, desktop computers, video game consoles, smart card readers, video cameras, televisions, vehicles, etc.) are equipped with optical sensors (e.g., ambient light sensors, proximity sensors, etc.). Optical sensors typically comprise a plurality of pixels, each pixel comprising a photodiode configured to absorb photons and collect photo generated carriers.

If pixels have different spectral properties (e.g., color sensitivity) then crosstalk from one pixel (e.g., green sensitivity) into an adjacent pixel (e.g., red sensitivity) may give a false reading resulting in an erroneous color data being output. Reducing crosstalk between the pixels may increase the accuracy of the output data.

SUMMARY

According to one aspect, there is provided an optical sensor comprising a plurality of pixels, each pixel comprising: a photodetector and a semiconductor guard ring around the photodetector; wherein the photodetector and the semiconductor guard ring are dimensioned so that a fill factor of the pixel is less than or equal to 50%.

The photodetector may be configured to absorb at least one photon and collect at least one carrier generated thereby.

The semiconductor guard ring may be configured to prevent the at least one carrier from being collected by the photodetector of an adjacent pixel or at least to make it more difficult.

In this way, the effectiveness of the semiconductor guard ring may be increased (i.e., the number of carriers crossing the semiconductor guard ring may be negligible).

The fill factor of the pixel may be defined as the ratio between a surface of the photodetector and a surface of the pixel.

The photodetector and the semiconductor guard ring may be dimensioned so that a fill factor of the pixel is greater than or equal to 33%.

The plurality of pixels may be part of a one dimensional array of pixels aligned along a first direction and the width of the semiconductor guard ring along the first direction may be greater than a width of the semiconductor guard ring along a second direction perpendicular to the first direction.

The plurality of pixels may be part of a two dimensional array of pixels aligned along a first direction and a second direction perpendicular to the first direction and the width of the semiconductor guard ring along the first direction may be equal to a width of the semiconductor guard ring along the second direction.

The optical sensor may be an ambient light sensor.

Each pixel may comprise: a readout circuit configured to determine an ambient light level based on a voltage across the photodetector.

The readout circuit may be configured to determine an ambient light level based on a number of times a voltage across the photodetector is reset to a predetermined reverse bias voltage over an exposure time.

The readout circuit may be configured to determine an ambient light level based on a voltage across the photodetector at the end of the exposure time.

The readout circuit may be configured to repeat the following steps over the exposure time: connect the photodetector to a reverse bias voltage supply so that a voltage across the photodetector is reset to the predetermined reverse bias voltage; and disconnect the photodetector from the reverse bias voltage supply so that the voltage across the photodetector decreases upon photons being absorbed and carriers generated thereby being collected.

The readout circuit may be configured to repeat the following step over the exposure time: increment a coarse value when the voltage across the photodetector is below a threshold.

The readout circuit may be configured to: reset a fine value at the beginning of the exposure time; and increment the fine value at a periodicity less than a periodicity at which the coarse value is incremented.

The periodicity at which the fine value may be incremented at least twice less than the periodicity at which the coarse value is incremented.

The readout circuit may be configured to combine the coarse value and the fine value at the end of the exposure time to determine the ambient light level.

Each pixel may comprise a band pass filter arranged over the photodiode.

Each pixel may comprise a band pass filter different from the band pass filter of an adjacent pixel.

The band pass filter may be one of an ultra violet band pass filter, a blue filter, a green filter, a red filter or an infrared filter.

The band pass filter may be arranged over the semiconductor guard ring. In this way, the band pass filter may be larger than the photodiode ensuring that each photon absorbed by the photodiode passes through the band pass filter.

Each pixel may comprise: an optically reflective coating arranged over the semiconductor guard ring.

According to another aspect there is provided an apparatus comprising any of the above optical sensor.

The apparatus may comprise a mobile phone, a tablet computer, a desktop computer, a laptop computer, a video game console, a video door, a smart watch, a vehicle, etc.

BRIEF DESCRIPTION OF THE DRAWINGS

Reference will now be made, by way of example only, to the accompanying drawings in which:
FIG. 1A is a cross-section view of a pixel;
FIG. 1B is a front view of the pixel of FIG. 1A;
FIG. 3A is a cross-section view of a pixel;
FIG. 3B is a top view of the pixel of FIG. 3A;

FIG. 6A is a cross-section view of a pixel according to an embodiment;

FIG. 6B is a top view of the pixel of FIG. 6A;

FIG. 7A is a cross-section view of a pixel according to an embodiment;

FIG. 7B is a top view of the pixel of FIG. 7A;

FIG. 13 is a front view of an array of pixels arranged in circle according to another embodiment.

DETAILED DESCRIPTION

Figure 2B:
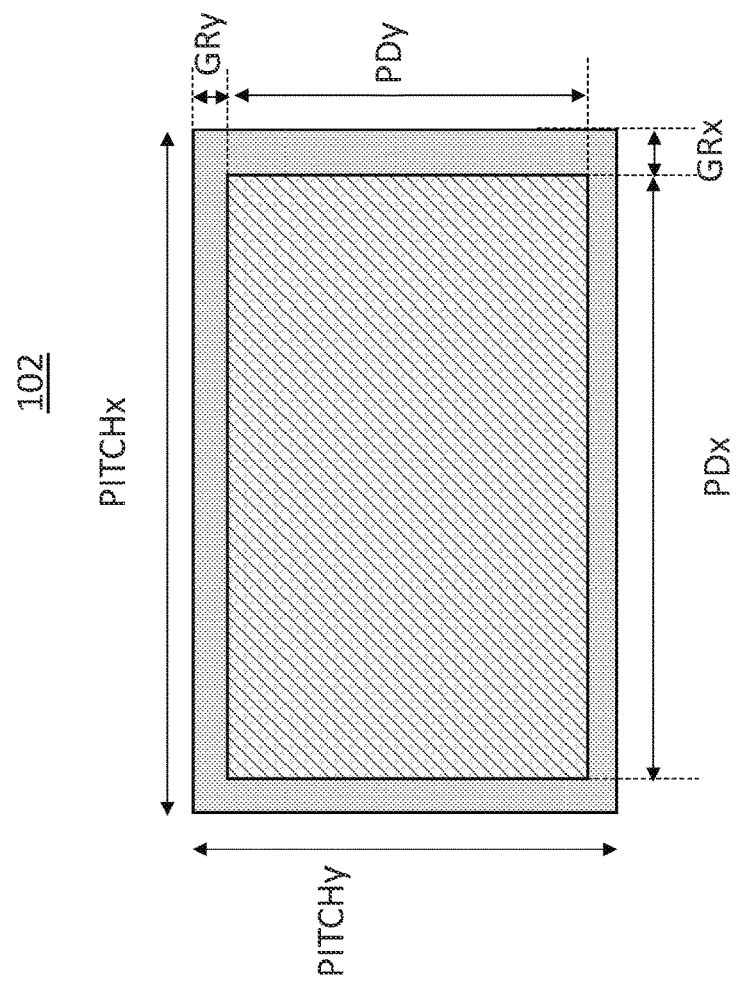
FIG. 2B is a top view of the pixel of FIG. 2A.

A diode is an electrical device allowing current to move through it in one direction with far greater ease than in the other. One kind of diode in modern circuit design is the semiconductor diode and is based on a PN junction.

A PN junction includes a P region (i.e., a semiconductor region doped with a P dopant) and an N region (i.e., a semiconductor region doped with an N dopant type). The N region contains electrons in excess while the P region contains holes in excess. When the PN junction is formed holes are naturally diffused from the P region to the N region and recombined with electrons. Likewise, electrons are naturally diffused from the N region to the P region and are recombined with holes. In this way, a depletion region with pairs of recombined holes and electrons is formed at the interface (i.e., the junction) of the P region and the N region.

The diffusion of holes from the P region leaves negative acceptor ions in the P region while the diffusion of electrons from the N region leaves positive donor ions in the N region. This creates an internal electric field that provides a force opposing the continued diffusion of holes and electrons. When the internal electric field is sufficiently high the diffusion of holes and electrons is interrupted and the depletion region reaches an equilibrium.

The width of the depletion region depends on the concentration of holes in the P region, the concentration of electrons in the N region and a voltage supply applied to the PN junction.

When the voltage supply is a forward bias voltage supply, the P region is connected with a positive terminal of the voltage supply and the N region is connected with a negative terminal of the voltage supply. In this way, the holes in the P region and the electrons in the N region are pushed toward the interface of the P region and the N region. The width of the depletion region decreases.

When the voltage supply is a reverse bias voltage supply, the P region is connected with a negative terminal of the voltage supply and the N region is connected with a positive terminal of the voltage supply. In this way, the holes in the P region and the electrons in the N region are pushed away from the interface of the P region and the N region. The width of the depletion region increases.

A photodiode is a particular type of diode configured to generate a current when illuminated. A photodiode may be operated in photovoltaic mode, photoconductive mode or avalanche mode.

In the photovoltaic mode, the PN junction is not biased. When photons with sufficient energy are absorbed, electron-hole pairs are formed in the depletion region and separated due to the internal electric field. The electrons migrate to the N region and the holes migrate to the P region. When a load is connected to the PN junction, electrons in excess in the N region may recombine with holes in excess in the P region via the load generating a current.

In the photoconductive mode, the PN junction is reverse biased at a voltage below a breakdown voltage. When photons with sufficient energy are absorbed, electron-hole pairs are formed in the depletion region and separated due to the internal field. The electrons migrate toward the N region and the holes migrate toward the P region due to the internal electric field. The electrons may recombine with holes in the N region and the holes may recombine with electrons in the P region generating a current.

In the avalanche mode, the PN junction is reverse biased at a voltage exceeding a breakdown voltage. When a photon with sufficient energy is absorbed, electron-hole pairs are formed in the depletion region and separated due to the internal field. The electrons are accelerated and migrate toward the N region and the holes are accelerated and migrate toward the P region. Some electrons may recombine with holes in the N region and some holes may recombine with electrons in the P region. Some electrons may collide with atoms and form further electron-hole pairs in the depletion region. In turn, these electron-hole pairs are separated due to the internal field, and so on, generating a self-sustained current.

FIGS. 1A and 1B represent a pixel 2. The pixel 2 may be part of a one dimensional array of pixels (i.e., the pixels are only aligned along a direction x) or a two dimensional array of pixels (i.e., the pixels are aligned along a direction x and along a direction y). The pixel 2 may be part of an optical sensor (e.g., ambient light sensor, proximity sensor, etc.).

The pixel 2 comprises a photodiode 4. The photodiode 4 is based on a PN junction and includes a P region 6 (i.e., a region doped with a P dopant) and an N region 8 (i.e., a region doped with an N dopant). In an implementation, the P region 6 is an epitaxial layer of P dopant type grown on a silicon substrate (not represented) and the N region 8 is a well of N dopant type formed within the epitaxial layer. The photodiode 4 comprises a depletion region (also known as depletion layer or depletion zone) that is naturally formed at the interface (i.e., junction) of the P region 6 and the N region 8 as described above.

The photodiode 4 comprises an anode (not represented) connected to the P region 6 and a cathode (not represented) connected to the N region 8.

As shown in FIG. 1B, the pixel 2 has a pitch PITCHx along the direction x and a pitch PITCHy along the direction y.

The photodiode 4 has a width PDx along the direction x and a width PDy along the direction y. Here, PDx is equal to PITCHx and PDy is equal to PITCHy. As a result, the fill factor of the pixel 2 (i.e., the ratio of the area of the photodiode to the area defined by the pitch) is 100%.

$$\text{Fill factor} = \frac{PDx \times Pdy}{\text{PITCH}x \times \text{PITCH}y} = 100\%$$

The fill factor of the pixel may be defined as the ratio between the surface of the photodiode 4 and the surface of the pixel 2.

With the pixel 2 of FIGS. 1A and 1B, when the photodiode 4 absorbs a photon and an electron-hole pair is formed in the depletion region, the electron-hole pair is separated due to the internal field and sometimes the electron and the hole may migrate toward the N region 8 and P region 6 of an adjacent pixel. In other words, the electron-hole pair may be collected by the adjacent pixel causing "crosstalk".

One option in very large scale integration (VLSI) to reduce crosstalk is to surround the photodiode with one or more semiconductor guard rings. The semiconductor guard rings are annuli of wells which may be reversed biased. The semiconductor guard rings may be concentric. The semiconductor guard rings may have a width between 1 μm and 100 μm. The semiconductor guard rings isolate the photodiode of a pixel from the photodiode of an adjacent pixel reducing crosstalk.

The thickness of the semiconductor guard rings may be comprised between 1 μm and 2 μm. The thickness of the semiconductor guard rings may be smaller than the thickness of the epitaxial layer in which they are implanted. The thickness of the epitaxial layer may be comprised between 3 μm and 5 μm. In this way, some photo generated electrons and holes may diffuse under the semiconductor guard rings causing crosstalk.

In "triple well" process technology, a separate (thicker) semiconductor guard ring may be used for further isolation. However, this may change the spectral response and quantum efficiency in undesirable ways.

Figure 2A:
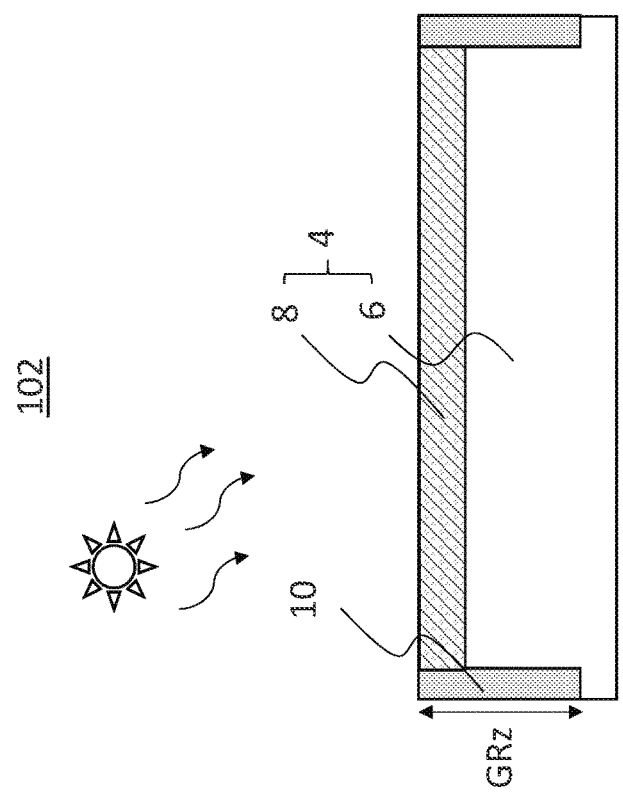
FIG. 2A is a cross-section view of a pixel.

FIGS. 2A and 2B represent a pixel 102. The pixel 102 is identical to the pixel 2 (shown in FIGS. 1A and 1B) except that it comprises a semiconductor guard ring 10 surrounding the photodiode 4. The semiconductor guard ring 10 isolates the photodiode 4 and reduces the number of photo generated electrons and holes in the photodiode 4 being collected by the photodiode of an adjacent pixel. In this way, crosstalk between the photodiode 4 of the pixel 102 and the photodiode of an adjacent pixel (not represented) may be reduced.

The semiconductor guard ring 10 may comprise a well of N dopant type formed within the P region 6. The semiconductor guard ring 10 and the P region 6 may be reversed biased.

The semiconductor guard ring 10 may be coated with a non-absorbing and/or reflective material (e.g., metal) so that photons impinging on the semiconductor guard ring 10 are not absorbed and/or are reflected.

The semiconductor guard ring 10 may have a thickness GRz along a direction z perpendicular to the direction x and the direction y less than or equal to the thickness of the P region 6 along the direction z.

The semiconductor guard ring 10 has a width GRx along the direction x and a width GRy along the direction y. Here, PDx is less than PITCHx and PDy is less than PITCHy. As a result, the fill factor of the pixel 102 (i.e., the ratio of the area of the photodiode to the area defined by the pitch) is less than 100%.

$$\text{Fill factor} = \frac{PDx \times Pdy}{\text{PITCH}x \times \text{PITCH}y} < 100\%$$

The effectiveness of a semiconductor guard ring may increase with the width of the semiconductor guard ring. The wider the semiconductor guard ring, the fewer photo generated electrons and holes may diffuse across the semiconductor guard ring. However, the semiconductor guard ring may collect photo generated electrons and holes. As a result, sensitivity and/or responsivity of the photodiode may be reduced.

Moreover, on optical sensors which have numerous (e.g., more than 10,000) small pixels (e.g., pitch smaller than 5 μm), the size of the semiconductor guard rings may be prohibitive. On optical sensors which have a few (e.g., less than 100) large (e.g., pitch comprised between 10 μm and 500 μm) pixels, semiconductor guard rings are possible but the number of photo generated electrons and holes collected by the photodiode is reduced.

FIGS. 3A and 3B represent a pixel 202. The pixel 202 is similar to the pixel 102 (shown in FIGS. 2A and 2B) except that the N region 8 is smaller (i.e., the width of the N region 8 along the direction x is less than the width of the P region 6 along the direction x and/or the width of the N region 8 along the direction y is less than the width of the P region 6 along the direction y). The N region 8 is spaced away from the semiconductor guard ring 10 so that the N region 8 is surrounded by the P region 6. In this way, the photodiode 4 of the pixel 202 may have the same photo absorption area as the photodiode 4 of the pixel 102 but the intrinsic capacitance of the photodiode 4 of the pixel 202 may be less than the intrinsic capacitance of the photodiode 4 of the pixel 102.

Figure 4:
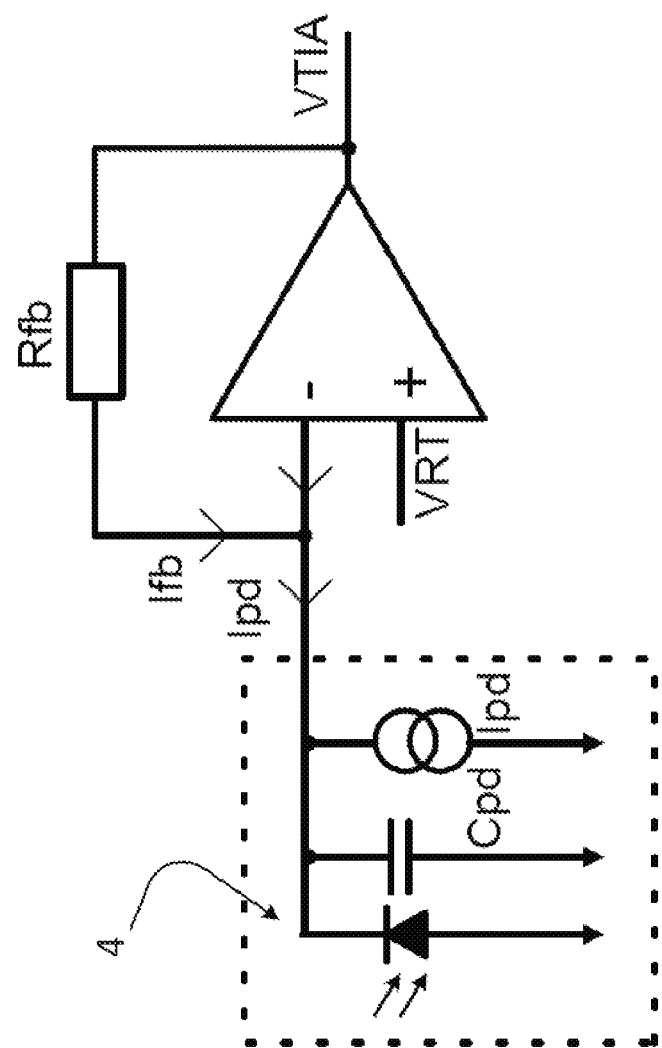
FIG. 4 is a schematic diagram of a readout circuit suitable for reading out the pixel of FIGS. 1A and 1B, the pixel of FIGS. 2A and 2B and/or the pixel of FIGS. 3A and 3B.

FIG. 4 is a schematic diagram of a readout circuit suitable for reading out the pixel 2 (shown in FIGS. 1A and 1B), the pixel 102 (shown in FIGS. 2A and 1B) or the pixel 202 (shown in FIGS. 3A and 3B) and determine a light level, for example an ambient light level. The photodiode 4 is modelled as an ideal photodiode, an intrinsic capacitor Cpd and an ideal source of current Ipd connected in parallel.

The readout circuit comprises a transimpedance amplifier arrangement. The readout circuit comprises an operational amplifier with a non-inverting input, an inverting input and an output. The readout circuit further comprises a feedback resistor Rfb.

In an implementation, the anode of the photodiode 4 is connected to a ground voltage supply. The cathode of the photodiode 4 is connected to the inverting input of the operational amplifier. The non-inverting input of the operational amplifier is connected to a voltage supply VRT. The inverting input of the operational amplifier is connected to the output of the operational amplifier by the feedback resistor Rfb. The output of the operational amplifier provides a voltage VTIA indicative of a light level, for example an ambient light level.

$$VTIA = VRT + Ipd \times Rfb$$

The higher VTIA, the higher the light level. The lower VTIA, the lower the light level. The output of the operational amplifier may be connected to the input of an analog to digital converter to convert the voltage VTIA from analog to digital.

As can be seen, the voltage VTIA is proportional to the current generated by the photodiode 4 and to the feedback resistor Rfb. The feedback resistor Rfb can be increased to compensate for the reduction in the current generated by the photodiode 4 when the semiconductor guard ring 10 is used.

Let us consider an example where PDx and PDy are equal to 40 µm and GRx and GRy are equal to 5 µm. The fill factor of the pixel 2 (shown in FIGS. 1A and 1B) would be equal to 100%.

$$\text{Fill factor} = \frac{PDx \times Pdy}{PITCHx \times PITCHy} = \frac{40 \times 40}{40 \times 40} = 100\%$$

That is, 100% of the photons impinge on the photodiode 4 and are absorbed.

By contrast, the fill factor of the pixel 102 (shown in FIGS. 2A and 2B) and the pixel 202 (shown in FIGS. 3A and 3B) would be equal to 64%.

$$\text{Fill factor} = \frac{PDx \times Pdy}{PITCHx \times PITCHy} = \frac{40 \times 40}{(40 + 2 \times 5) \times (40 + 2 \times 5)} = 64\%$$

That is, 64% of the photons impinge on the photodiode 4 and are absorbed whereas 36% of the photons impinge on the semiconductor guard ring 10 and are not absorbed.

In other words, the current generated by the photodiode 4 of the pixel 102 (shown in FIGS. 2A and 2B) and the pixel 202 (shown in FIGS. 3A and 3B) is equal to 64% of the current generated by the photodiode 4 of the pixel 2 (shown in FIGS. 1A and 1B). If the same voltage VTIA is required for all three pixels, the feedback resistor Rfb should be 56% (i.e., 1/0.64=1.56) larger to readout the pixel 102 (shown in FIGS. 2A and 2B) and the pixel 202 (shown in FIGS. 3A and 3B) than to read out the pixel 2 (shown in FIGS. 1A and 1B).

The transimpedance amplifier is optionally followed by analog-to digital conversion (ADC). Increasing the size of the semiconductor guard rings reduces the fill factor and so also the photo generated electrons and holes collected by the photodiode. This reduces the output voltage from the transimpedance amplifier. The feedback resistor may be increased but this would increase the level of the Johnson noise from the resistor and this also increases the area and therefore cost required for the feedback resistor. Thus, the semiconductor guard ring 10 may reduce crosstalk but at a significant cost and/or space.

Figure 5:
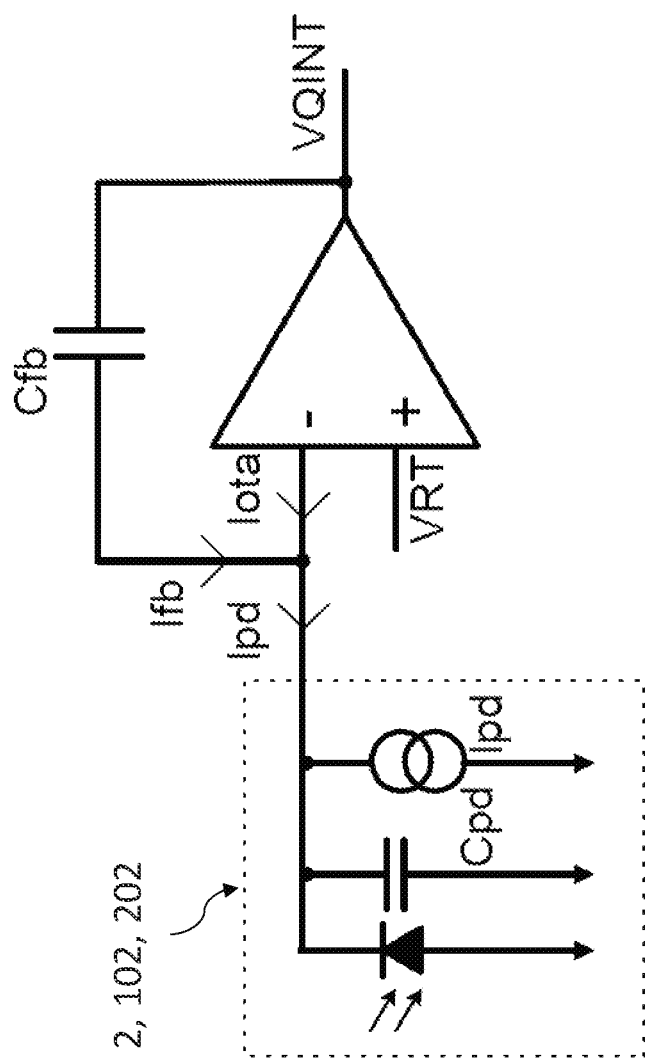
FIG. 5 is a schematic diagram of another readout circuit suitable for reading out the pixel of FIGS. 1A and 1B, the pixel of FIGS. 2A and 2B and/or the pixel of FIGS. 3A and 3B.

FIG. 5 is a schematic diagram of another readout circuit suitable for reading out the pixel 2 (shown in FIGS. 1A and 1B), the pixel 102 (shown in FIGS. 2A and 1B) or the pixel 202 (shown in FIGS. 3A and 3B) and determine a light level, for example an ambient light level. Again, the photodiode 4 is modelled as an ideal photodiode, an intrinsic capacitor Cpd and an ideal source of current Ipd connected in parallel.

The readout circuit comprises a charge integrator arrangement. The readout circuit comprises an operational amplifier with a non-inverting input, an inverting input and an output. The readout circuit further comprises a feedback capacitor Cfb.

In an implementation, the anode of the photodiode 4 is connected to a ground voltage supply. The cathode of the photodiode 4 is connected to the inverting input of the operational amplifier. The non-inverting input of the operational amplifier is connected to a voltage supply VRT. The inverting input of the operational amplifier is connected to the output of the operational amplifier by the feedback capacitor Cfb. The output of the operational amplifier provides a voltage VQINT indicative of a light level, for example an ambient light level.

$$\frac{dVQINT}{dt} = \frac{Ipd}{Cfb}$$

$$VQINT = \frac{1}{Cfb} \int Ipd$$

The higher VQINT, the higher the light level. The lower VQINT, the lower the light level. The output of the operational amplifier may be connected to the input of an analog to digital converter to convert the voltage VQINT from an analog signal to a digital signal.

Another option to reduce crosstalk between pixels is the use of micro lenses. Micro lenses are typically used on optical sensors with a large number (e.g., more than 10,000) of small pixels (e.g., pitch smaller than 5 µm). Each micro lens collects and focuses photons onto the center of a photodiode and consequently away from a photodiode of an adjacent pixel. Micro lenses may be produced using photolithography and typically reflowed to form a "bubble" (i.e., a hemisphere over the photodiode to collect the photons). Micro lenses may be difficult to pattern and etch a thick resist (e.g., greater than 2.5 µm) and this limits the size of the micro lens.

If infrared photons are collected, these lower-energy photons penetrate deeper into the silicon before forming electron-hole pairs which are more likely to diffuse toward the photodiode of an adjacent pixel resulting in higher crosstalk.

Another option to reduce crosstalk between pixels is deep trench isolation. A trench may be etched in the silicon during manufacture and filled with an optically reflective or absorbing material. In this way, photo generated electrons and holes are prevented from crossing this trench reducing crosstalk. However, this is currently relatively expensive and typically used on only larger format sensors (Megapixel and above).

As well as reducing crosstalk, it is sometimes required to increase the distance between the color filters. On small pixels (e.g., pitch less than 5 µm), dye material may be used and this can be patterned accurately (e.g., accuracy less than 100 nm). However, if a higher spectral response is required, then multi-layer dielectric filter stacks may be deposited which may require a much larger distance between the color filters (e.g., distance between 10 µm and 100 µm).

One or more of the following embodiments provide a solution to reduce crosstalk. This may be at a relatively low cost. Some embodiments may be suitable for multi-layer dielectric filters.

Generally pixel designers take great care to increase the fill factor of a pixel to increase the number of photons absorbed and the number of photo generated electrons and holes collected. In one or more of the following embodiments the fill factor is deliberately reduced. By employing a suitable readout circuit, the pixel may be read out. This may be accomplished without losing significant response.

FIGS. 6A and 6B represent a pixel 302 according to one embodiment. The pixel 302 may be part of a one dimensional array of pixels (i.e., the pixels are only aligned along a direction x) or a two dimensional array of pixels (i.e., the pixels are aligned along a direction x and along a direction y). The pixel 302 may be part of an optical sensor (e.g., ambient light sensor, a proximity sensor, etc.).

The pixel 302 comprises a photodiode 304. The photodiode 304 is based on a PN junction and includes a P region 306 (i.e., a region doped with a P dopant) and an N region 308 (i.e., a region doped with an N dopant). In an implementation, the P region 306 is an epitaxial layer of P dopant type grown on a silicon substrate (not represented) and the N region 308 is a well of N dopant type formed within the epitaxial layer. The photodiode junction 304 comprises a depletion region (also known as depletion layer or depletion zone) that is naturally formed at the interface (i.e., junction) of the P region 306 and the N region 308 as described above.

The photodiode 304 comprises an anode (not represented) connected to the P region 6 and a cathode (not represented) connected to the N region 308.

The pixel 302 has a pitch PITCHx along the direction x and a pitch PITCHy along the direction y. The photodiode 304 has a width PDx along the direction x and a width PDy along the direction y. Here, PDx is less than PITCHx and PDy is less than PITCHy.

The pixel 302 comprises a semiconductor guard ring 310 surrounding the photodiode 304. The semiconductor guard ring 10 isolates the photodiode 304 and reduces the number of photo generated electrons and holes in the photodiode 304 being collected by the photodiode of an adjacent pixel. In this way, crosstalk between the photodiode 304 of the pixel 302 and the photodiode of an adjacent pixel may be reduced.

The semiconductor guard ring 310 may comprise a well of N dopant type formed within the P region 306. The semiconductor guard ring 310 and the epitaxial layer or P region 306 may be reversed biased.

The semiconductor guard ring 310 may be coated with a non-absorbing and/or reflective material (e.g., metal) so that photons impinging on the semiconductor guard ring 310 are not absorbed and/or are reflected.

The semiconductor guard ring 310 may have a thickness GRz along a direction z perpendicular to the direction x and the direction y less than or equal to the thickness of the P region 306 along the direction z.

The semiconductor guard ring 310 has a width GRx along the direction x and a width GRy along the direction y.

In an implementation, the pixel 302 is part of a one dimensional array of pixels aligned along the direction x. In such implementation, the constraint on the semiconductor guard ring may be relaxed and the width GRx of the semiconductor guard ring 310 may greater than the width GRy of the semiconductor guard ring 310. Alternatively, the width GRx of the semiconductor guard ring 310 may be less than or equal to the width GRy of the semiconductor guard ring 310.

In another implementation, the pixel 302 is part of a two dimensional array of pixels aligned along the direction x and the direction y. The width GRx of the semiconductor guard ring 10 may be equal to the width GRy of the semiconductor guard ring 310. Alternatively, the width GRx of the semiconductor guard ring 310 may be greater than or less than the width GRy of the semiconductor guard ring 310.

The photodiode 304 and the semiconductor guard ring 310 are dimensioned so that the fill factor of the pixel 302 is less than or equal to 50% or 40%. Preferably, the fill factor of the pixel 302 is greater than or equal to 33%.

$$\text{Fill factor} = \frac{PDx \times Pdy}{\text{PITCH}x \times \text{PITCH}y} \leq 50\%$$

By achieving such a fill factor, the number of photo generated electrons and holes crossing the semiconductor guard ring 310 is reduced and the crosstalk between the photodiode 304 of the pixel 302 and the photodiode of an adjacent pixel may be brought to a negligible level.

FIGS. 7A and 7B represent a pixel 402 according to another embodiment. The pixel 402 is similar to the pixel 302 (shown in FIGS. 6A and 6B) except that the N region 308 of the photodiode 304 is smaller (i.e., the width of the N region 308 along the direction x is less than the width of the P region 306 along the direction x and/or the width of the N region 308 along the direction y is less than the width of the P region 306 along the direction y). The N region 308 is spaced away from the semiconductor guard ring 10 so that the N region 308 is surrounded by the P region 306. In this way, the photodiode 304 of the pixel 402 may have the same photo absorption area as the photodiode 304 of the pixel 302 but the intrinsic capacitance Cpd of the photodiode 304 of the pixel 402 may be less than the intrinsic capacitance of the photodiode 304 of the pixel 302.

With the pixel 302 (shown in FIGS. 6A and 6B) or the pixel 402 (shown in FIGS. 7A and 7B) and the reduced the fill factor, the current Ipd generated by the photodiode 4 may be reduced.

When the pixel 302 (shown in FIGS. 6A and 6B) or the pixel 402 (shown in FIGS. 7A and 7B) has a fill factor of 50%, then the current Ipd generated by the photodiode 4 of the pixel 302 or the pixel 402 will be half the current Ipd generated by the photodiode 4 of the pixel 2 (shown in FIGS. 1A and 1B) with a fill factor of 100%.

When the pixel 302 or the pixel 402 has a fill factor of 25%, the current Ipd generated by the photodiode 4 of the pixel 302 or the pixel 402 will be a quarter of the current Ipd generated by the photodiode 4 of the pixel 2 (shown in FIGS. 1A and 1B) with a fill factor of 100%.

According to one or more embodiments, the intrinsic capacitance Cpd of the photodiode 4 as such may be used to convert the current Ipd generated by the photodiode 4 into a voltage Vpd across the photodiode 4.

$$\frac{dVpd}{dt} = -\frac{Ipd}{Cpd}$$

$$Vpd = -\frac{1}{Cpd}\int Ipd$$

As can be seen from the above equations, the voltage Vpd across the photodiode 4 is proportional to the integral of the current Ipd generated by the photodiode 4 and inversely proportional to the intrinsic capacitance Cpd of the photodiode 4.

By reducing the fill factor of the photodiode 4, and therefore by reducing the size of the photodiode 4, both the current Ipd generated by the photodiode 4 and the intrinsic capacitance Cpd of the photodiode 4 may be reduced in similar proportion. As a result, it is possible to reduce the fill factor of the photodiode 4 whilst maintaining the same voltage Vpd across the photodiode 4.

As the voltage Vpd across the photodiode 4 is inversely proportional to the intrinsic capacitance Cpd of the photodiode 4, by reducing the intrinsic capacitance Cpd, the voltage Vpd across the photodiode 4 may be increased.

For a determined fill factor, the photodiode 4 of the pixel 302 (shown in FIGS. 6A and 6B) and 402 (shown in FIGS. 7A and 7B) generates the same current Ipd. However, the intrinsic capacitance Cpd of the photodiode 4 of the pixel 402 is smaller than the intrinsic capacitance of the photodiode 4 of the pixel 302. As a result, the voltage across the photodiode 4 of the pixel 402 is higher than the voltage across the photodiode 4 of the pixel 302.

Using the intrinsic capacitance Cpd of the photodiode 4 of the pixel 302 (shown in FIGS. 6A and 6B) or the pixel 402 (shown in FIGS. 7A and 7B) to convert the current Ipd into voltage raises issues. The depletion region in the photodiode 4 of the pixel 302 or the pixel 402 is a function of the reverse bias voltage and as the photodiode 4 of the pixel 302 or the pixel 402 collects photo generated electrons and holes, the voltage Vpd across the photodiode 4 will decrease and the depletion region will decrease. As decreasing the depletion region causes an increase in the intrinsic capacitance, the voltage Vpd across the photodiode 4 of the pixel 302 and 402 may not decrease linearly.

A further issue is photon shot noise. Due to the quantum nature of photonic energy, there may be a variation in the number of electrons and holes collected by the photodiode 4 of the pixel 302 and 402. The standard deviation of the number of electrons and holes collected is the square root of the mean number of electrons and holes collected.

$$SNRMAX = SQRT(\text{Number of electrons and holes collected})$$

As a result, a large number of electrons and holes need to be collected. In an analog to digital converter which has 16 bit signal to noise ratio, $2^{32}$ (i.e., $2^{(16*2)}$) electrons and holes need to be collected. If the pixel 302 or 402 operate over a 1V swing, this implies that the photodiode 4 has an intrinsic capacitance Cpd of 687 pF (i.e., $2^{32}*1.6E-19$ F). This is a large capacitance and would typically require a photodiode of 4 mm$^2$ (i.e., 2 mm*2 mm). This may be impractical as this is typically the size of a whole optical sensor.

A solution proved by some embodiments to achieve both better linearity and better signal to noise ratio is to operate the pixel 302 (shown in FIGS. 6A and 6B) or the pixel 402 (shown in FIGS. 7A and 7B) over many cycles (i.e., collect charge until it is nearly saturated, reset the pixel and repeat) over an exposure time. At the end of the exposure time, the number of cycles can be used to determine a light level, for example an ambient light level.

Further improvement may be obtained by taking into consideration the voltage Vpd across the photodiode 4 of the pixel 302 or the pixel 402 at the end of the exposure time.

Figure 8:
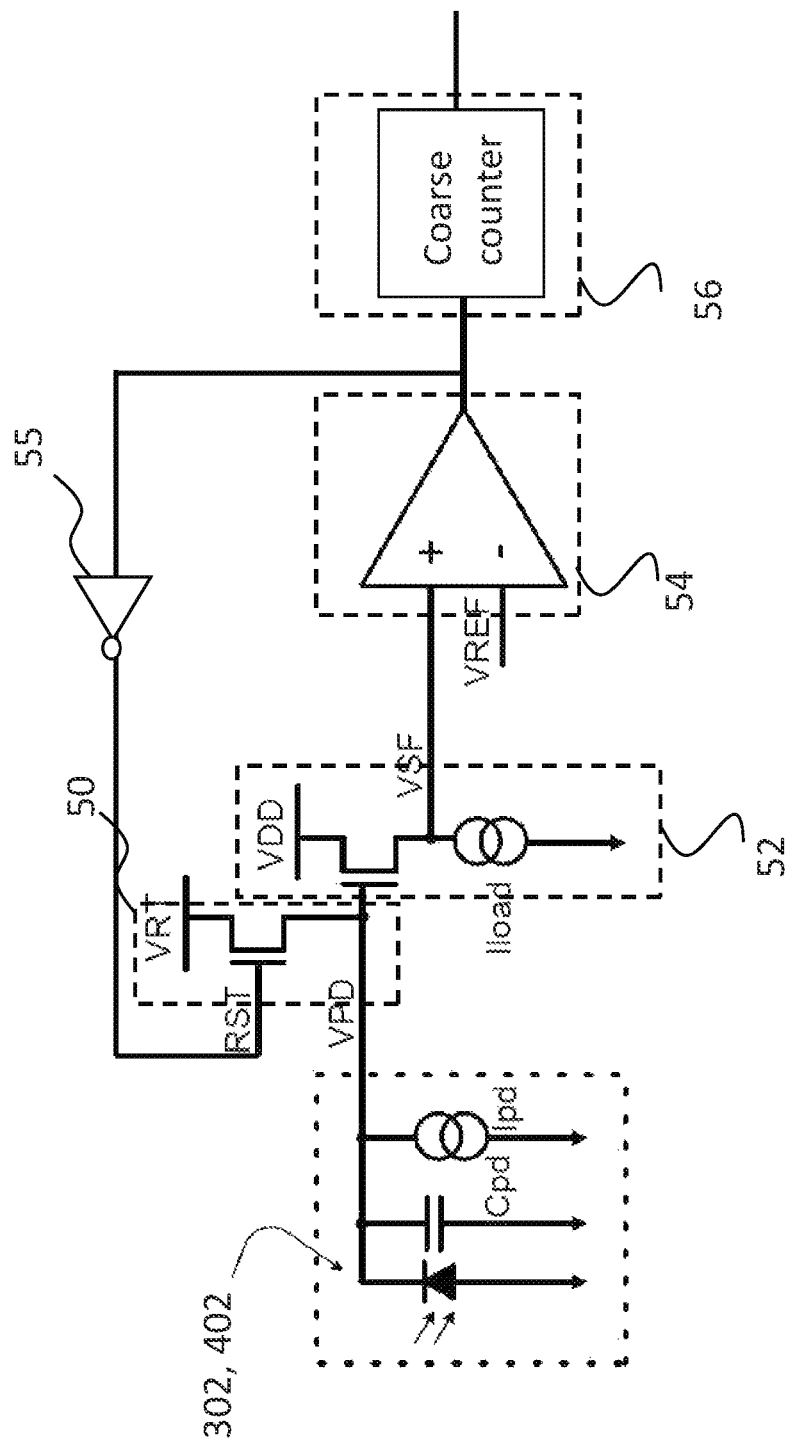
FIG. 8 is a schematic diagram of a readout circuit suitable for reading out the pixel of FIGS. 6A and 6B and/or the pixel of FIGS. 7A and 7B.

FIG. 8 is schematic diagram of a readout circuit suitable for reading out the pixel 302 (shown in FIGS. 6A and 6B) or the pixel 402 (shown in FIGS. 7A and 7B) to determine a light level, for example an ambient light level.

The photodiode 4 of the pixel 302 or 402 is modelled as an ideal photodiode, an intrinsic capacitor Cpd and an ideal source of current Ipd connected in parallel.

The readout circuit may comprise a resetting circuit 50, an impedance matching circuit 52 (optional), a comparator circuit 54 and an output circuit 56.

The resetting circuit 50 is configured to alternatively connect the photodiode 4 to a reverse bias voltage supply VRT and disconnect the photodiode 4 from the reverse bias voltage supply VRT.

When the resetting circuit 50 connects the photodiode 4 to the reverse bias voltage supply VRT, the voltage across the photodiode 4 is reset to a predetermined reverse bias voltage. When the resetting circuit 50 disconnects the photodiode 4 from the reverse bias voltage supply VRT, the voltage across the photodetector decreases upon photons being absorbed and photo generated electrons and holes being collected by the photodiode 4.

In an implementation, the anode of the photodiode 4 is connected to a ground voltage supply and the cathode of the photodiode 4 is connected to the resetting circuit 50. The resetting circuit 50 circuit comprises a transistor switch configured to alternatively connect the photodiode 4 to the reverse bias voltage supply VRT and disconnect the photodiode 4 from the reverse bias voltage supply VRT based on a control signal RST. For example, the switch may an N channel MOSFET (NMOS) transistor comprising a drain, a source and a gate. The drain conduction terminal may be connected to the reverse bias voltage supply VRT. The source conduction terminal may be connected to the cathode of the photodiode 4. The gate may be controlled by the control signal RST. It will be understood that the switch may be a PMOS transistor or any other type of transistor.

The impedance matching circuit 52 is configured to maximize the power transfer from the photodiode 4 to the comparator circuit 54.

In an implementation, the impedance matching circuit 52 comprises a transistor configured as a source-follower to connect a voltage supply VDD to a source of current Iload. For example, the transistor may be an N channel MOSFET (NMOS) transistor comprising a drain, a source and a gate. The drain conduction terminal may be connected to the voltage supply VDD. The source drain conduction terminal may be connected to current source Iload at which the voltage VSF is generated. The gate may be connected to the cathode of the photodiode 4.

The comparator circuit 54 is configured to compare the VSF voltage representative of the voltage across the photodiode 4 to a threshold voltage (VREF) and output a high level or a low level based on the comparison.

In an implementation, the comparator circuit 54 comprises an operational amplifier comprising a non-inverting input, an inverting input and an output. However, it will be understood that the comparator circuit 54 may be any type of comparator. The non-inverting input is connected to the source of the switch of the impedance matching circuit 52. The inverting input is connected to a reference voltage supply VREF. The output is at a high level when the voltage at the non-inverting input of the operational amplifier (i.e., the voltage across the photodiode 4) is above the voltage at the inverting input of the operational amplifier (i.e., VREF). The output is at a low level when the voltage at the non-inverting input of the operational amplifier (i.e., the voltage across the photodiode 4) is below the voltage at the non-inverting input of the operational amplifier (i.e., VREF). The output is connected to an inverter gate 55.

It will be understood that additional circuitry may be provided between the comparator circuit 54 and the resetting circuit to ensure a long enough resetting pulse and a full reset.

It will also be understood that in another implementation the inverter gate 55 can be omitted by swapping connecting the inverting input to the source of the switch of the impedance matching circuit 52 and connecting the non-inverting input to the reference voltage supply VREF.

The output circuit 56 is configured to output a value indicative of a light level, for example an ambient light level, based on the output of the comparator circuit 54.

In an implementation, the output 56 comprises a coarse counter connected to the output of the operational amplifier of the comparator circuit 54. The coarse counter is configured to reset a coarse value to '0' at the beginning of an exposure time and to increment the coarse value when the output of the comparator circuit switches from the low level to the high level. The coarse value at the end of the exposure time is indicative of a light level, for example an ambient light level, and may be output. The coarse value may then be converted in a Lux circuit or another circuit.

Figure 9:
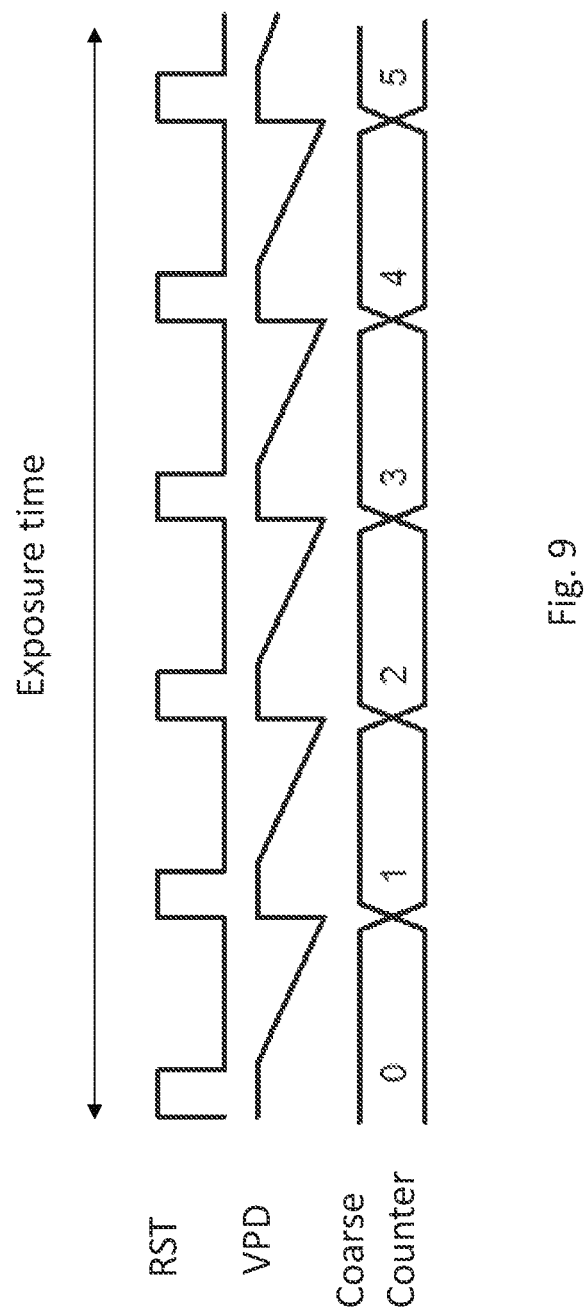
FIG. 9 is a time diagram illustrating the operation of the readout circuit of FIG. 8.

FIG. 9 is an example of a time diagram showing the operation of the readout circuit of FIG. 8. In an example, the coarse value at the end of the exposure time is equal to '5'.

Figure 10:
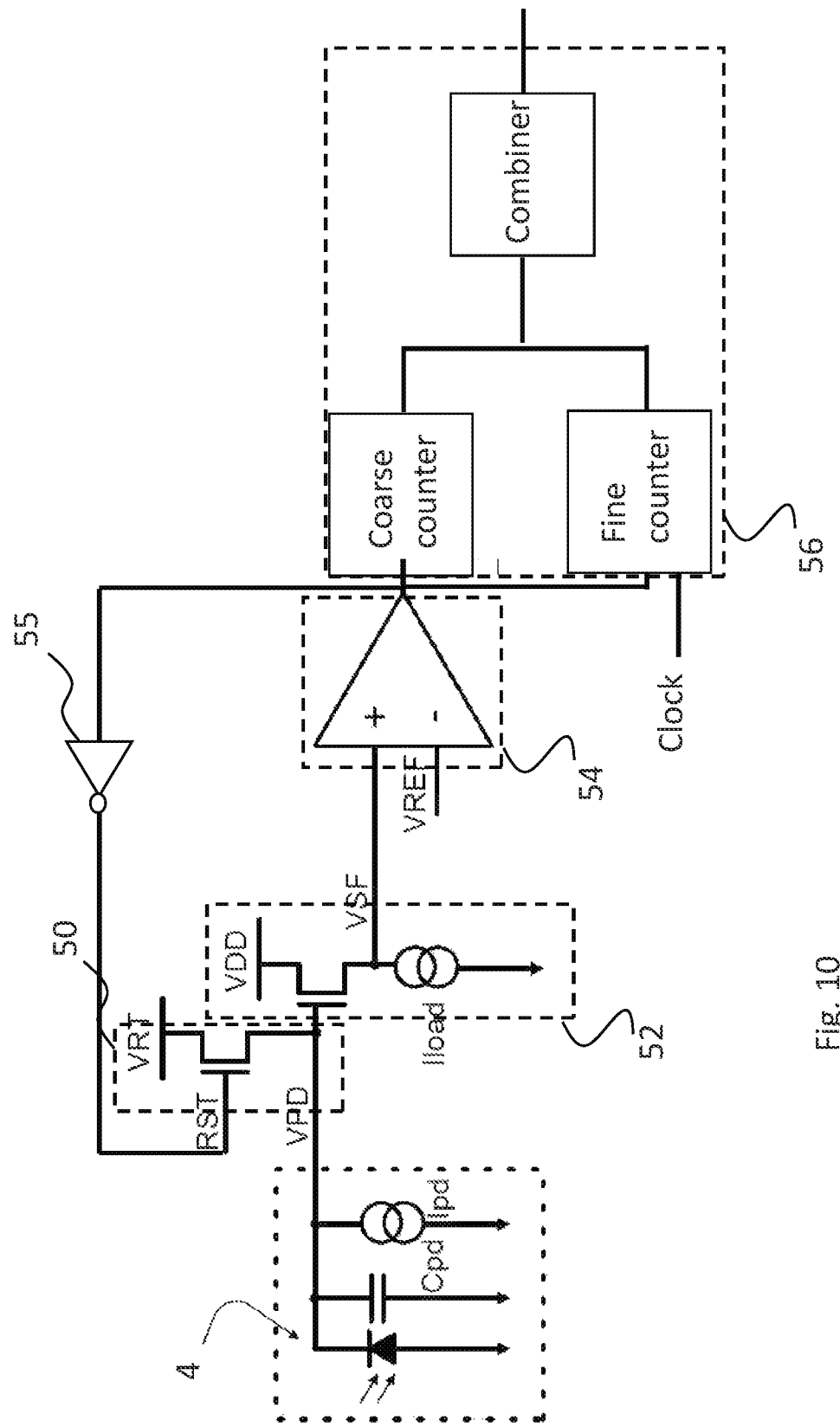
FIG. 10 is a schematic diagram of a readout circuit suitable for reading out the pixel of FIGS. 6A and 6B and/or the pixel of FIGS. 7A and 7B.

FIG. 10 is schematic diagram of another readout circuit suitable for reading out the pixel 302 (shown in FIGS. 6A and 6B) or the pixel 402 (shown in FIGS. 7A and 7B) and determine a light level, for example an ambient light level.

The readout circuit of FIG. 10 is similar to the readout circuit of FIG. 8 except the output circuit 56 further comprises a fine counter and a combiner.

The fine counter is connected to the output of the operational amplifier of the comparator circuit 54. The fine counter is configured to reset a fine value to '0' at the beginning of the exposure time and to increment the fine value when a clock signal switches from a low level to a high level. The periodicity of the clock signal is set to be less than the periodicity at which the resetting circuit 50 resets the reverse bias voltage across the photodiode 4 to the predetermined reverse bias voltage. In other words, the frequency of the clock signal is set to be higher than the frequency at which the resetting circuit 50 resets the reverse bias voltage across the photodiode 4 to the predetermined reverse bias voltage In this way, the fine value is incremented by a clock (e.g., system clock) at a periodicity less than the periodicity at which the coarse value is incremented. The periodicity of the clock signal may be determined empirically. The periodicity of the clock signal may be at least twice less than the periodicity at which the resetting circuit 50 resets the reverse bias voltage across the photodiode 4 to the predetermined reverse bias voltage.

The fine counter may be configured to stop (i.e., abstain from being incremented) when the photodiode 4 is being reset and to re-start (i.e., be incremented) once the photodiode 4 has being reset.

It may take between 1 us to 5 us for the photodiode 4 to reset and the circuit to stabilize and therefore the fine counter may be stopped for a few clock cycles. The inverter 55 may not provide enough delay to reset the photodiode 4 and additional circuitry (e.g., monostable or digital gates) may be used to extend an RST pulse. Alternatively, the inverter 55 may provide enough delay in which case the additional circuitry may not be necessary.

The combiner is connected to the coarse counter and the fine counter. The combiner is configured to combine the coarse value and the fine value at the end of the exposure time and to determine a combined value indicative of a light level, for example an ambient light level. The combined value COM may be determined as the product between the coarse value by the fine value divided by the fine value when the coarse value was last incremented.

$$COM = \text{Coarse value} \times \frac{\text{Fine value}}{\text{Fine value when Coarse value was last incremented}}$$

The combined value may then be converted in a Lux circuit or another circuit.

Figure 11:
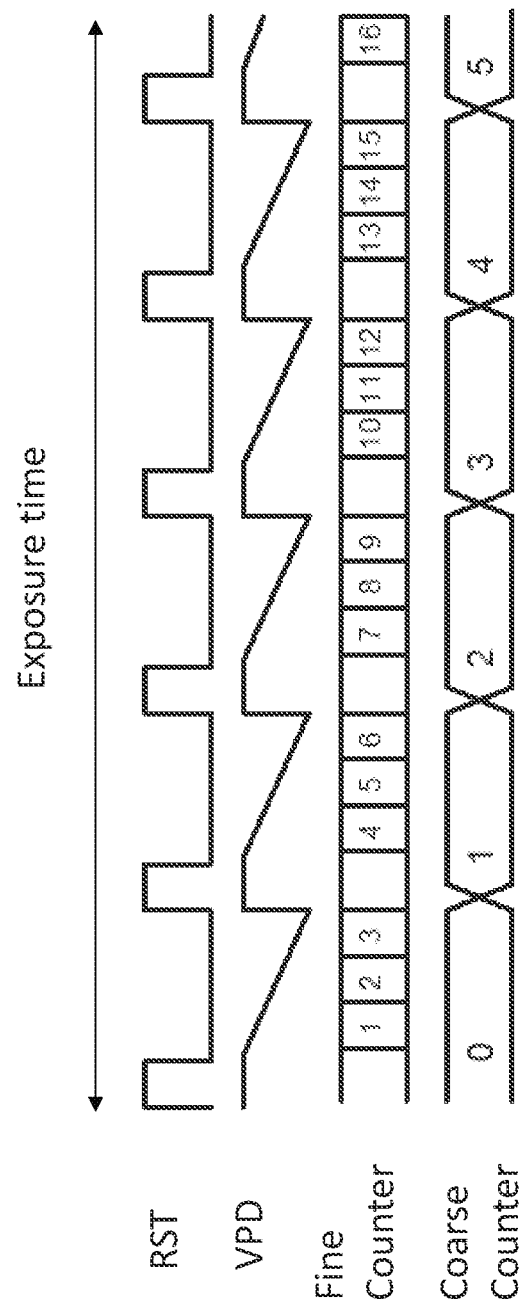
FIG. 11 is a time diagram illustrating the operation of the readout circuit of FIG. 10.

FIG. 11 is an example of a time diagram showing the operation of the readout circuit of FIG. 10. In the example, the coarse value at the end of the exposure time is equal to '5', the fine value at the end of the exposure time is equal to '16' and the fine value when the coarse value was last incremented from '4' to '5' was equal to '15'.

$$\text{Combined value} = 5 \times \frac{16}{15} = 5.33$$

Figure 12:
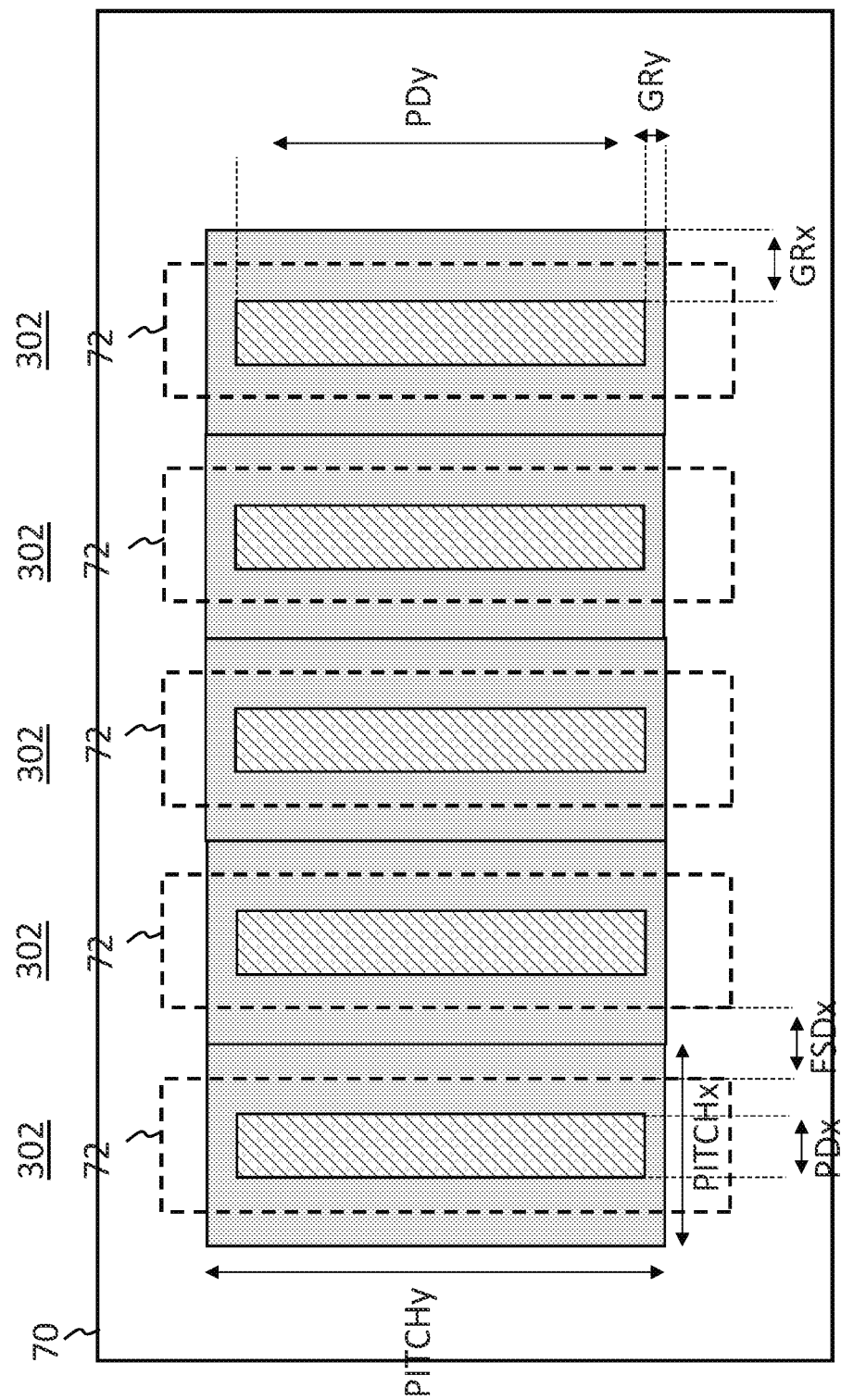
FIG. 12 is a front view of a one dimensional array of pixels according to an embodiment.

FIG. 12 represents an optical sensor, such as an ambient light sensor. The optical sensor comprises a sensor die 70. The optical sensor comprises pixels 302 (shown in FIGS. 6A and 6B) arranged on the sensor die 70. Here, the optical sensor comprises five pixels 302 but it will be understood that it could comprise a different number of pixels. Also, it will be understood that the optical sensor may comprise, alternatively or additionally, pixels 402 302 (shown in FIGS. 7A and 7B).

The pixels 302 are aligned along the direction x and form a one dimensional array of pixels. As a result, the constraint on the semiconductor guard rings 10 of the pixels 302 is relaxed and the width GRx of the semiconductor guard rings 10 is greater than the width GRy of the semiconductor guard rings 10.

The photodiodes 4 of the pixels 302 are covered by band pass filters 72. In an implementation, the photodiodes 4 of the pixels 302 may be covered by different band pass filters 72 specific to each pixel 302. For example, from the left hand side to the right hand side, a pixel 302 may be covered by an ultra violet band pass filter 72, a pixel 302 may be covered by a blue band pass filter 72, a pixel 302 may be covered by a green band pass filter 72, a pixel 302 may be covered by a red band pass filter 72 and a pixel 302 may be covered by an infrared band pass pixel 72. In this way, each spectral component of ambient light may be determined individually.

It will be understood that in some implementations the band pass filters 72 may be arranged in a different order and/or may not all be different. For example, in some implementation the band pass filters 72 may only comprise blue filters, green filters and red filters.

It will also be understood that in some implementations the band pass filters 72 may all be the same.

The band pass filters 72 may be wider than the photodiodes 4 along the direction x and/or along the direction y. In this way, all photons impinging on the photodiodes 4 and absorbed by the photodiodes 4 pass through the band pass filters 72. In an implementation, the band pass filters 72 may also be wider than the pixels 2 along the direction y. Typically, the filter enclosure of the photodiodes may be the same for the direction x and the direction y. For example, the filter enclosure may be comprised between 10 µm and 30 µm. However in the case of a one dimensional array there may be little/no penalty for having a larger filter enclosure of photodiodes in the direction Y than in the direction x. For example, the filter enclosure may be equal to 50 µm The band pass filters 72 may be distant from one another along the direction x. For example, the distance between the band pass filters 72 along the direction x may be comprised between 50 nm and 200 nm The width FSDx between band pass filters 72 along the direction x may be less than the distance (2*GRx) between photodiodes 4 along the direction x.

It is often the case that the width PDx of the photodiodes is determined by the minimum width FSDx between band pass filters. Using one or more of the above embodiments, it is possible to increase the width FSDx between band pass filters without increasing the pitch PITCHx of the pixels or reducing the output of the pixels.

For example, the bandpass filter manufacture may require a minimum width FSDx between band pass filters of 30 µm.

Some existing pixels require a width PDx for the photodiodes of 90 μm and a pitch PITCHx for the pixels of 120 μm (90 μm+30 μm).

By contrast, one or more of the above embodiments may allow a width PDx for the photodiodes of 10 μm and a pitch PITCHx for the pixels of 40 μm (10 μm+30 μm). That is, the area of the pixels may be reduced, reducing the size of the optical sensor. Moreover, the fill factor may be reduced, reducing crosstalk.

FIG. 13 shows a variant of the embodiment of FIG. 12. As can be seen, the pixels 302 are no longer arranged linearly (Cartesian coordinates). Instead, they are arranged circularly (Polar coordinates).

In this variant, the pixels 302 are no longer rectangular. However, each photodiode 304 and each semiconductor guard ring 310 are still be dimensioned so that the fill factor of the pixel 302 is less than or equal to 50% or 40% and preferably so that the fill factor of the pixel 302 is greater than or equal to 33%.

It will be understood that in another variant (not represented) an array of pixels may comprise a plurality of pixels arranged along a plurality of concentric circles.

Various embodiments with different variations have been described here above. It should be noted that those skilled in the art may combine various elements of these various embodiments and variations. For example, areas of the N dopant type could be swapped for areas of the P dopant type and vice versa.

Such alterations, modifications, and improvements are intended to be part of this disclosure, and are intended to be within the scope of the claims. Accordingly, the foregoing description is by way of example only and is not intended to be limiting. The invention is limited only as defined in the claims and the equivalents thereto.

The invention claimed is:

1. An ambient light sensor, comprising:
    a plurality of pixels;
    wherein each pixel comprises a photodetector; and
    a readout circuit configured to determine an ambient light level, said readout circuit comprising:
        a reset transistor coupled between a reset voltage node and the photodetector;
        a source-follower transistor having a control terminal coupled to the photodetector and an output terminal configured to provide a photodetector voltage;
        a comparator having a first input configured to receive the photodetector voltage and a second input configured to receive a threshold voltage, wherein the comparator is configured to assert a reset signal applied to a control terminal of the reset transistor; and
        a first counter circuit having an input configured to receive the reset signal, said counter circuit configured to count a number of times the reset signal is asserted over an exposure time, wherein the number of times counted is indicative of the ambient light level.

2. The ambient light sensor of claim 1, further comprising a second counter reset in response to beginning of the exposure time and configured to count a number of pulses of a clock signal, where a combination of the number of times counted by the first counter and the number of pulses counted by the second counter is indicative of the ambient light level.

3. The ambient light sensor of claim 2, wherein the second counter is configured to inhibit counting of the pulses of a clock signal for a duration of time in response to each assertion of the reset signal.

4. The ambient light sensor of claim 2, further comprising a combiner circuit configured to combine the number of times (Coarse value) counted by the first counter and the number of pulses (Fine value) counted by the second counter to generate a combined value (COM) in accordance with the following formula:

$$COM = \text{Coarse value} \times \frac{\text{Fine value}}{\text{Fine value when Coarse value was last incremented}}.$$

5. The ambient light sensor of claim 4, further comprising a conversion of the combined value (COM) to a Lux value indicating the ambient light level.

6. The ambient light sensor of claim 1, wherein each pixel further comprises a guard ring around the photodetector.

7. The ambient light sensor of claim 6, wherein the photodetector and the guard ring are dimensioned so that a fill factor of the pixel is less than or equal to 50%.

8. The ambient light sensor of claim 7, wherein the photodetector and the guard ring are dimensioned so that the fill factor of the pixel is greater than or equal to 33%.

9. The ambient light sensor of claim 6, wherein the plurality of pixels are part of a one dimensional array of pixels aligned along a first direction and wherein a width of the guard ring along the first direction is greater than a width of the guard ring along a second direction perpendicular to the first direction.

10. The ambient light sensor of claim 6, wherein the plurality of pixels are part of a two dimensional array of pixels aligned along a first direction and a second direction perpendicular to the first direction, and wherein a width of the guard ring along the first direction is equal to a width of the guard ring along the second direction.

11. The ambient light sensor of claim 6, wherein each pixel comprises a band pass filter arranged over the photodetector.

12. The ambient light sensor of claim 11, wherein the band pass filter is arranged over the guard ring.

13. The ambient light sensor of claim 6, wherein each pixel comprises an optically reflective coating arranged over the guard ring.

* * * * *